United States Patent
Ang et al.

(10) Patent No.: US 7,704,885 B2
(45) Date of Patent: Apr. 27, 2010

(54) SEMICONDUCTOR DEVICE AND METHOD FOR FABRICATING THE SAME

(75) Inventors: Kern-Huat Ang, Hsinchu (TW); Po-Jen Wang, Taichung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/802,693

(22) Filed: May 24, 2007

(65) Prior Publication Data

US 2008/0293238 A1 Nov. 27, 2008

(51) Int. Cl.
*H01L 21/302* (2006.01)

(52) U.S. Cl. .................. 438/692; 438/637; 438/624; 438/639; 438/666; 438/668; 438/675; 438/629; 438/672; 438/648; 438/683; 438/642; 438/644; 438/622; 438/734; 438/697; 438/689; 438/706; 438/719; 438/723; 438/724; 257/763; 257/734; 257/750; 257/764; 257/774; 257/296; 257/303; 257/E23.16; 257/E21.259; 257/E21.024; 257/E21.025; 257/E21.252; 257/E21.579

(58) Field of Classification Search .................. 438/692
See application file for complete search history.

(56) References Cited

U.S. PATENT DOCUMENTS

| | | | | |
|---|---|---|---|---|
| 5,593,920 A | * | 1/1997 | Haslam et al. | 438/625 |
| 5,714,804 A | * | 2/1998 | Miller et al. | 257/763 |
| 6,015,751 A | * | 1/2000 | Liu | 438/637 |
| 6,255,226 B1 | * | 7/2001 | Zheng et al. | 438/734 |
| 6,287,971 B1 | * | 9/2001 | Park et al. | 438/689 |
| 6,372,633 B1 | * | 4/2002 | Maydan et al. | 438/637 |
| 6,448,649 B1 | * | 9/2002 | Lee et al. | 257/758 |
| 6,483,736 B2 | | 11/2002 | Johnson et al. | |
| 6,509,274 B1 | * | 1/2003 | Guo et al. | 438/697 |
| 6,548,374 B2 | * | 4/2003 | Chung | 438/424 |
| 6,624,011 B1 | | 9/2003 | Subramanian et al. | |
| 6,649,451 B1 | | 11/2003 | Vyvoda et al. | |
| 6,803,309 B2 | * | 10/2004 | Chou et al. | 438/653 |
| 6,905,800 B1 | * | 6/2005 | Yuen et al. | 430/5 |
| 7,030,044 B2 | * | 4/2006 | Ruelke et al. | 438/786 |
| 7,098,130 B1 | * | 8/2006 | Kim et al. | 438/638 |
| 7,268,069 B2 | * | 9/2007 | Ishida et al. | 438/629 |
| 7,488,687 B2 | * | 2/2009 | Park et al. | 438/700 |
| 2001/0004551 A1 | * | 6/2001 | Domae et al. | 438/648 |
| 2001/0035547 A1 | * | 11/2001 | Isogai | 257/296 |
| 2004/0201104 A1 | * | 10/2004 | Domae et al. | 257/758 |
| 2004/0214442 A1 | * | 10/2004 | Lee et al. | 438/692 |

(Continued)

*Primary Examiner*—Fernando L Toledo
*Assistant Examiner*—Ankush k Singal
(74) *Attorney, Agent, or Firm*—Birch, Stewart, Kolasch & Birch, LLP

(57) ABSTRACT

A method for fabricating a semiconductor device is provided. The method of fabricating a semiconductor device provides a semiconductor substrate; forming a first insulating layer, a first conductive layer and a chemical mechanical polishing (CMP) stop layer over the semiconductor substrate in sequence; forming openings in the chemical mechanical polishing (CMP) stop layer and the underlying first conductive layer to expose the first insulating layer, thereby leaving a patterned chemical mechanical polishing (CMP) stop layer and a patterned first conductive layer; forming a second insulating layer on the patterned chemical mechanical polishing (CMP) stop layer, filling in the openings; performing a planarization process to remove a portion of the second insulating layer until the patterned chemical mechanical polishing (CMP) stop layer is exposed, thereby leaving a remaining second insulating layer in the openings; removing the patterned chemical mechanical polishing (CMP) stop layer.

16 Claims, 9 Drawing Sheets

U.S. PATENT DOCUMENTS

2004/0259029 A1* 12/2004 Nagahara et al. ......... 430/270.1
2005/0142844 A1* 6/2005 Ahn ........................... 438/622
2005/0287803 A1* 12/2005 Lee ............................. 438/672
2006/0286728 A1* 12/2006 Kim ............................ 438/180

* cited by examiner

SEMICONDUCTOR DEVICE AND METHOD FOR FABRICATING THE SAME

BACKGROUND OF THE INVENTION

1. Field of the Invention

The invention relates to a semiconductor device and method for fabricating the same, and more particularly to an interconnect structure of a semiconductor device and method for fabricating the same.

2. Description of the Related Art

The ever-increasing demand for high-performance semiconductor devices has motivated the semiconductor industry to design and manufacture ultra-large-scale integrated (ULSI) circuits with smaller feature size, higher resolution, denser packaging, and multi-layer interconnects. ULSI technology places stringent demands on global planarity of the interlayer dielectric (ILD) layers. Compared with other planarization techniques, the chemical mechanical polishing (CMP) process produces excellent local and global planarization at low cost. It is thus widely adopted for planarizing inter-level dielectric (silicon dioxide) layers.

FIG. 1 shows a cross section of a conventional semiconductor device 150, and specifically illustrates an interconnect structure. An intermetal dielectric (IMD) layer 112 and an interconnect layer 104 are formed on the interlayer dielectric (ILD) layer 102 and the semiconductor substrate 100. The intermetal dielectric (IMD) layer 112 has a top 122 lower than a metal layer 104. The lower intermetal dielectric (IMD) layer 112 is formed with material loss or recesses by the conventional planarization process. A barrier layer 114 and a polyplug 116 subsequently formed on the metal layer 104 have residue or short problems if a misalignment problem occurs as shown in FIG. 1. Semiconductor device performance such as yield or reliability thus suffers because the recess problem of the intermetal dielectric (IMD) layer.

Thus, a novel and reliable method of fabricating a semiconductor device with more robust interconnect structure is desirable.

BRIEF SUMMARY OF INVENTION

A detailed description is given in the following embodiments with reference to the accompanying drawings.

To solve the described and other problems, the invention provides a semiconductor device and method for fabricating the same. An exemplary embodiment of a method for fabricating a semiconductor device comprises: providing a semiconductor substrate; sequentially forming a first insulating layer, a first conductive layer and a chemical mechanical polishing (CMP) stop layer over the semiconductor substrate; forming openings in the chemical mechanical polishing (CMP) stop layer and the underlying first conductive layer to expose the first insulating layer, thereby leaving a patterned chemical mechanical polishing (CMP) stop layer and a patterned first conductive layer; forming a second insulating layer on the patterned chemical mechanical polishing (CMP) stop layer and filling in the openings; performing a planarization process to remove a portion of the second insulating layer until the patterned chemical mechanical polishing (CMP) stop layer is exposed, thereby leaving a remaining second insulating layer in the openings; removing the patterned chemical mechanical polishing (CMP) stop layer.

Another exemplary embodiment of a semiconductor device comprises: a semiconductor substrate; a first insulating layer on the semiconductor substrate; a patterned first conductive layer and an adjacent second insulating layer on the first insulating layer, wherein the second insulating layer is higher than the patterned first conductive layer; a second conductive layer on the patterned first conductive layer.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1:
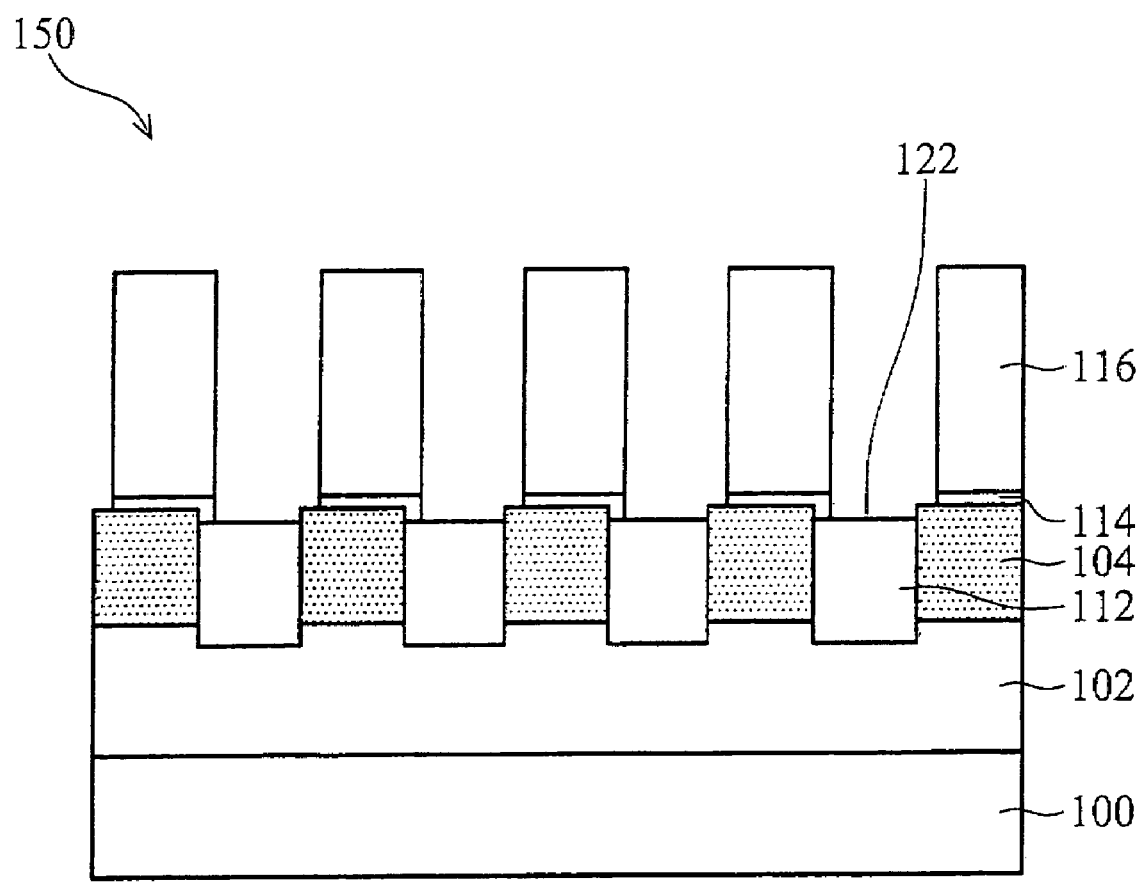
FIG. 1 shows a cross section of a conventional semiconductor device.

The following description is of the best-contemplated mode of carrying out the invention. This description is made for the purpose of illustrating the general principles of the invention and should not be taken in a limiting sense. The scope of the invention is best determined by reference to the appended claims.

FIGS. 2a to 2h show cross sections of an exemplary embodiment of a method of fabricating a semiconductor device. FIGS. 3a to 3g show cross sections of another exemplary method for fabricating a semiconductor device of the invention. Wherever possible, the same reference numbers are used in the drawing and the description to refer the same or like parts.

Figure 2A:
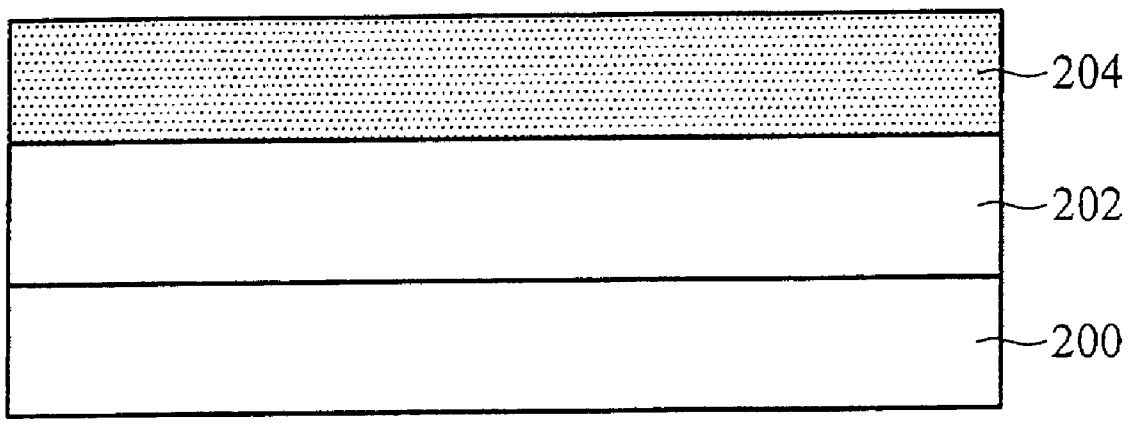
FIGS. 2a to 2h show cross sections of an exemplary method for fabricating a semiconductor device of the invention.

Referring to FIG. 2a, a semiconductor substrate 200 is provided. The semiconductor substrate 200 may comprise silicon, gallium arsenide, gallium nitride, strained silicon, silicon germanium, silicon carbide, carbide, diamond, bulk semiconductor, strained semiconductor, compound semiconductor, silicon on insulator (SOI), stacked SOI (SSOI), stacked SiGe on insulator (S—SiGeOI), SiGeOI, GeOI and other commonly used semiconductor substrates. The semiconductor substrate 200 may be a substrate with semiconductor devices formed thereon, for example, transistors, diodes, bipolar junction transistors (BJT), resistors, capacitors, inductors or other electrical elements.

A first insulating layer 202 is formed on the semiconductor substrate 200. The first insulating layer 202 may comprise a low dielectric constant (low-k) material formed by chemical vapor deposition (CVD). The low-k material may be defined as a dielectric material having a dielectric constant less than 3.9, that of a thermal silicon oxide. The low-k material may have a porous structure. The low-k materials may include carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, SiOC, SOG (spin on glass), FSG (fluorinated silica glass), HSQ (hydrogensilsequioxane) and/or other proper materials. In one embodiment, the first insulating layer 202 serves as an interlayer dielectric (ILD) layer or an intermetal dielectric (IMD) layer.

A first conductive layer 204 is then formed on the first insulating layer 202. In one embodiment, the first conductive layer 204 serves as an interconnect, memory bit-line or memory word-line. The first conductive layer 204 may be formed by chemical vapor deposition (CVD) and/or physical vapor deposition (PVD). The first conductive layer 204 may comprise metal, metal silicide or combinations thereof. In one embodiment, the first conductive layer 204 may comprise copper, aluminum, tungsten, titanium, titanium nitride, tantalum, tantalum nitride, metal silicide or combinations thereof The first conductive layer 204 may comprise multiple layers such as a liner layer and a metal layer in one example. The liner layer may use as diffusion barrier and adhesion enhancing layer. The liner layer may comprise titanium, titanium nitride, tantalum, tantalum nitride or combinations thereof. The liner layer may be formed by chemical vapor deposition (CVD) and/or physical vapor deposition (PVD). Then a metal layer may be formed on the liner layer by CVD, PVD, plating, and/or other suitable methods. The metal layer may include copper, aluminum, tungsten, metal silicide, or combinations thereof.

Figure 2B:
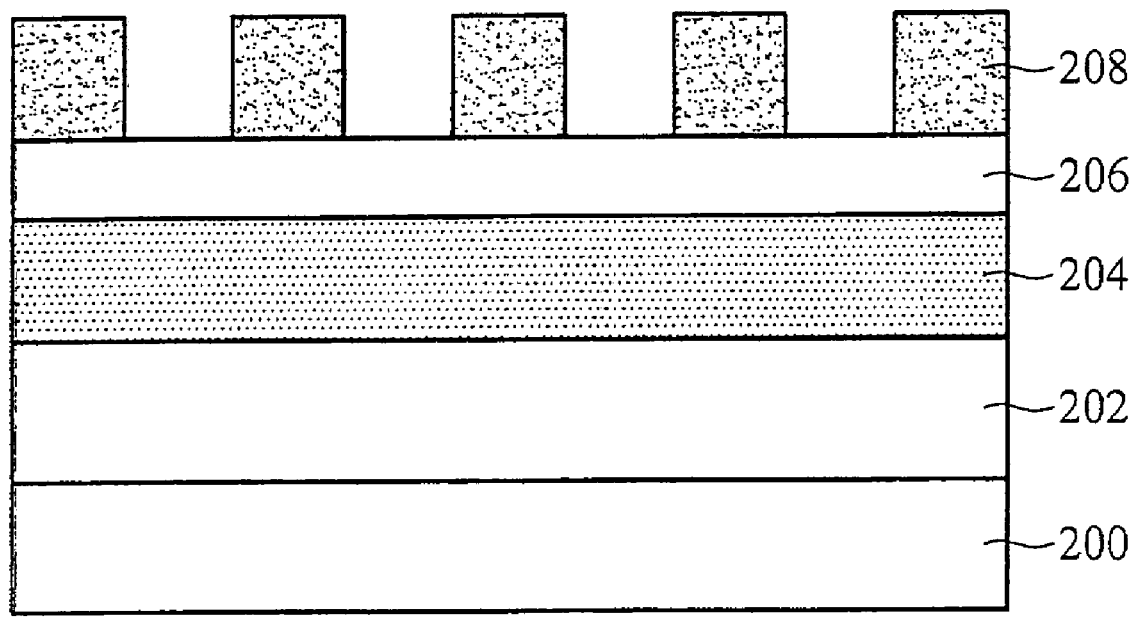

FIG. 2b illustrates a formation of a CMP stop layer 206. The CMP stop layer 206 is then formed on the first conductive layer 204. The CMP stop layer 206 may be formed by chemical vapor deposition (CVD) such as low pressure chemical vapor deposition (LPCVD) or plasma enhanced chemical vapor deposition (PECVD). The CMP stop layer 206 may comprise nitride-containing materials, for example, silicon nitride (SiN), titanium nitride (TiN) or combinations thereof. The CMP stop layer 206 serves as a stop layer for the subsequent planarization process. Next, a photoresist layer is formed on the CMP stop layer 206, following a photolithography process, to form a patterned photoresist layer 208. The patterned photoresist layer 208 is used to define an interconnect, memory bit-line or memory word-line position of the first conductive layer 204. After forming the CMP stop layer 206, a bottom anti-reflective coating (BARC) layer such as SiON may optionally be formed on the CMP stop layer 206. The BARC layer is used to reduce multiple interference in the photoresist layer 208. Thus critical dimension (CD) control and topography problems of the semiconductor device can be overcome. Also, the BARC layer can be replaced by the CMP stop 206 layer if the CMP stop layer 206 has a function of reducing multiple interference in photoresist.

Figure 2C:
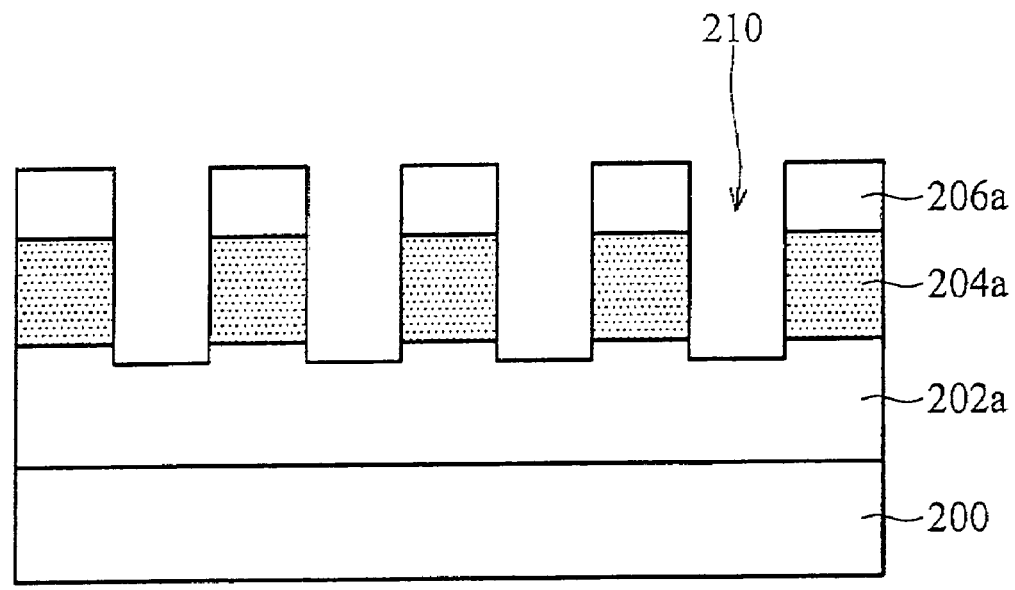

Referring to FIG. 2c, a plurality of openings 210 are formed in the CMP stop layer 206 and the underlying first conductive layer 204 to expose the first insulating layer 202, thereby leaving a patterned CMP stop layer 206a, a patterned first conductive layer 204a and a first insulating layer 202a. In one embodiment, the patterned first conductive layer 204a may be a bit line or word line pattern of a semiconductor device. The openings 210 may be formed by anisotropic etching using the patterned photoresist layer 208 as a mask. Next, the patterned photoresist layer 208 is removed.

Figure 2D:
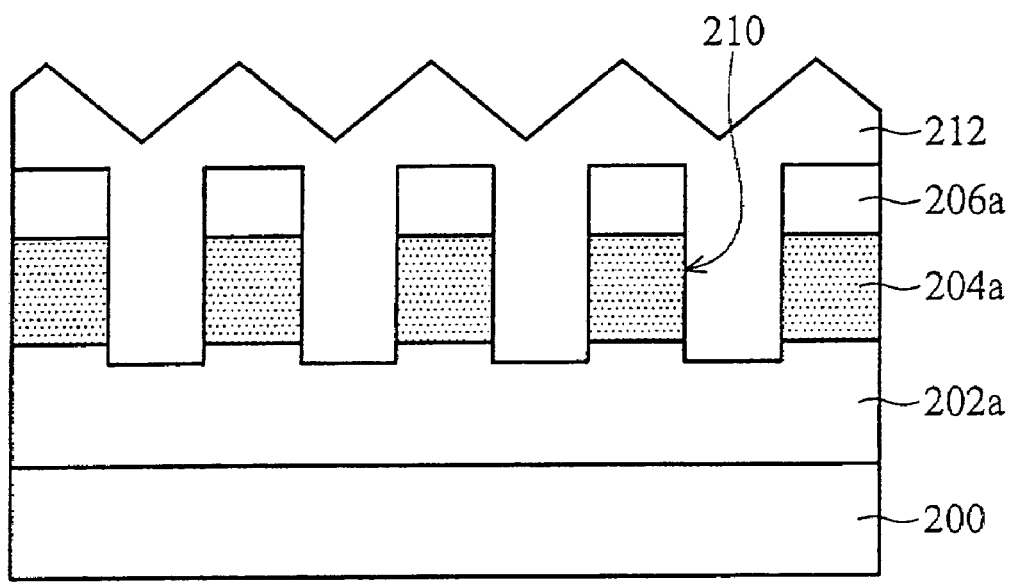

FIG. 2d illustrates formation of a second insulating layer 212. The second insulating layer 212 is formed on the patterned CMP stop layer 206a filling in the openings 210 by high density plasma CVD (HDP CVD). In high density plasma CVD process, deposition and sputtering etching are performed simultaneously. Thus the second insulating layer 212 can be filled in the openings 210 with a tapered profile. The second insulating layer 212 may comprise a low dielectric constant (low-k) material formed by chemical vapor deposition (CVD). The low-k material may be defined as a dielectric material having a dielectric constant of less than 3.9, that of a thermal silicon oxide. The low-k material may have a porous structure. The low-k materials may include carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, SiOC, SOG (spin on glass), FSG (fluorinated silica glass), HSQ (hydrogensilsequioxane) and/or other proper materials. In one embodiment, the second insulating layer 212 may comprise the same material as the first insulating layer 202. In one embodiment, the second insulating layer 212 serves as an intermetal dielectric (IMD) layer.

Figure 2E:
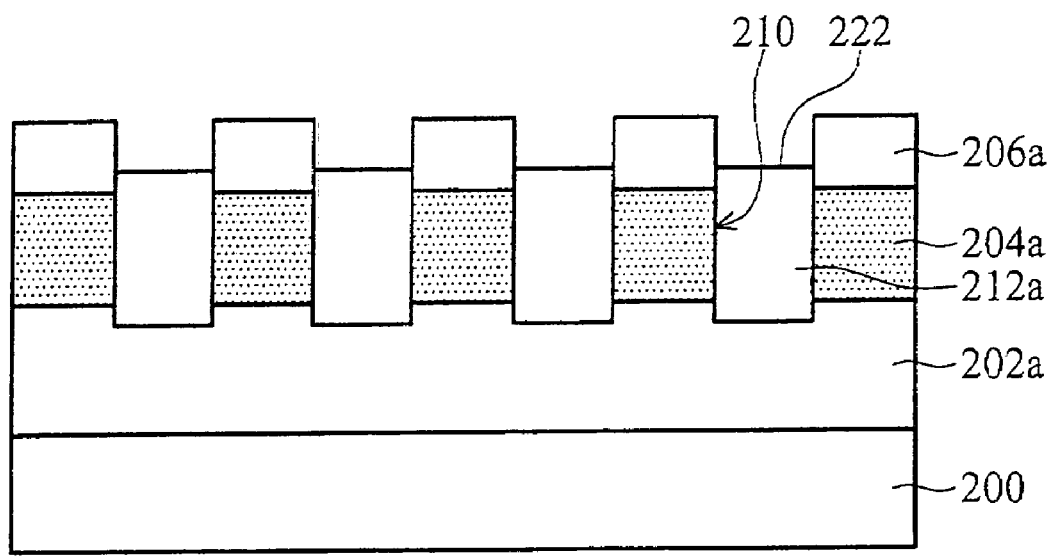
Figure 2F:
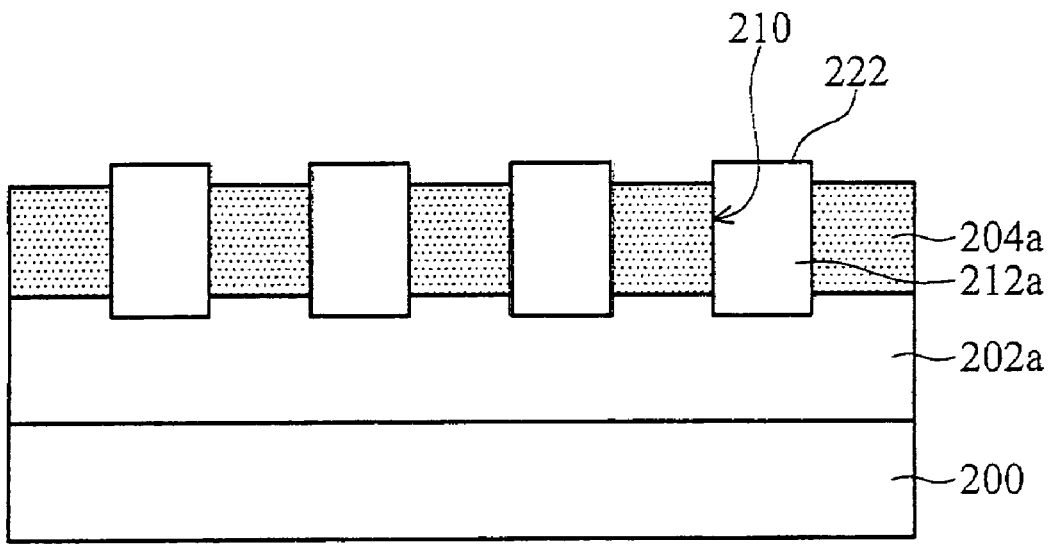

Referring to FIG. 2e, a planarization process such as chemical mechanical polishing (CMP) is performed to remove a portion of the second insulating layer 212 until the patterned CMP stop layer 206a is exposed, and thereby leaving a remaining second insulating layer 212a. In one embodiment, the patterned CMP stop layer 206a is used to terminate the CMP process. Because the patterned CMP stop layer 206a has a higher polishing rate selectivity than that of the second insulating layer 212, made of, for example, silicon oxide. The remaining second insulating layer 212a is thus formed with a top 222 higher than the patterned first conductive layer 204a and no recession occurs. Next, the patterned CMP stop layer 206a is removed as shown in FIG. 2f. In one embodiment, the patterned CMP stop layer 206a may be removed by wet etching, such as submersion in hot phosphoric acid ($H_3PO_4$). Alternatively, the patterned CMP stop layer 206a may be removed by an anisotropic etching process such as a dry etching process, for example, plasma etching.

Figure 2G:
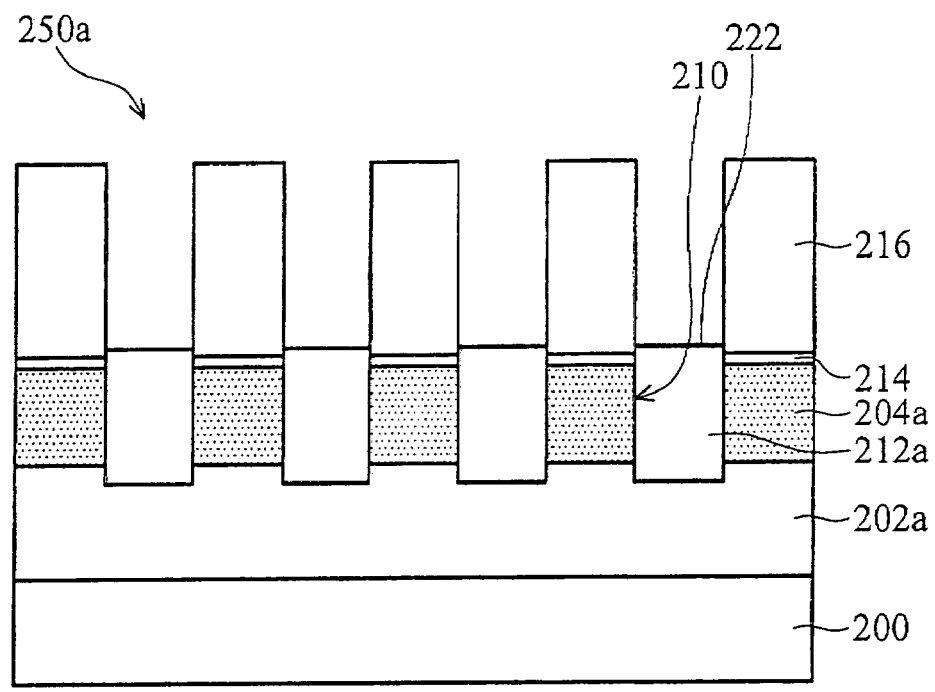

FIG. 2g illustrates formation of a barrier layer 214 and a second conductive layer 216. The barrier layer 214 is formed on the patterned first conductive layer 204a and the second conductive layer 216 is formed on the barrier layer 214. The second conductive layer 216 may be a conductive pillar formed by photolithography process. The second conductive layer 216 may serve as a plug or a via electrically connected to the patterned first conductive layer 204a through the barrier layer 214. In one embodiment, the barrier layer 214 may be formed optionally and serve as a diffusion barrier layer or an adhesion enhancing layer between the second conductive layer 216 and the patterned first conductive layer 204a. The barrier layer 214 may be formed by chemical vapor deposition (CVD) and/or physical vapor deposition (PVD). The barrier layer 214 may comprise metal. In one embodiment, the barrier layer 214 may comprise titanium (Ti), titanium nitride (TiN), tantalum (Ta), tantalum nitride (TaN) or combinations thereof. The second conductive layer 216 may be formed by chemical vapor deposition (CVD) and/or physical vapor deposition (PVD). The second conductive layer 216 may comprise polysilicon. In one embodiment, the second conductive layer 216 may comprise a diode device of a doped semiconductor layer and an undoped semiconductor layer to form a p-n junction, wherein the doped semiconductor layer may comprise an in-situ doped semiconductor layer formed by low pressure chemical vapor deposition (LPCVD) or a semiconductor layer doped by implanting impurities. The term "in-situ doped semiconductor layer" means that the semiconductor layer is implanted with impurities in one process step without an additional implantation process step. Thus the fabrication of a semiconductor device 250a is complete. Alternatively, a plurality of the semiconductor devices 250a may be laminated vertically by repeating the processes as shown in FIGS. 2a to 2g to form a 3-dimensional (3D) semiconductor device, and the number of the semiconductor devices 250b is not limited.

Figure 2H:
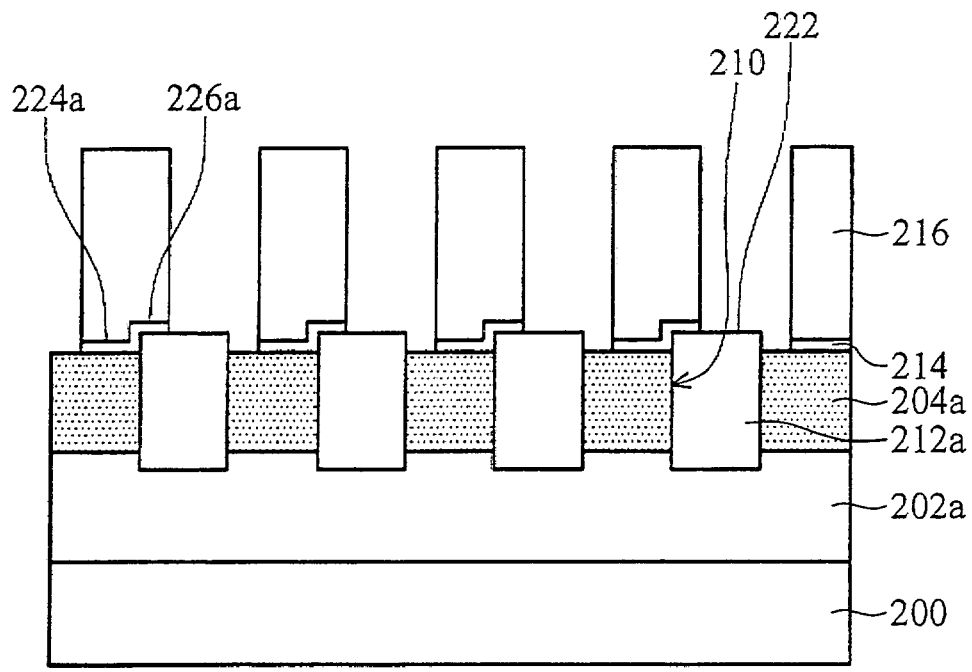

If a misalignment problem of the second conductive layer 216 occurs as shown in FIG. 2h. The second conductive layer 216 is formed with a first bottom portion 224a on the patterned first conductive layer 204a and a second bottom portion 226a on the remaining second insulating layer 212a. In this embodiment, the second bottom portion 226a is higher than the first bottom portion 224a. The second conductive layer 216 subsequently formed on the patterned first conductive layer 204a can be free from residue or short problems.

The exemplary embodiment of the semiconductor device 250a mainly comprises: a semiconductor substrate 200; a first insulating layer 202 on the semiconductor substrate 200; a patterned first conductive layer 204a and a adjacent second insulating layer 212a on the first insulating layer 202, wherein the remaining second insulating layer 212a is higher than the patterned first conductive layer 204a; a second conductive layer 216 on the patterned first conductive layer 204a.

In an exemplary embodiment, the patterned CMP stop layer 206a is formed on the first conductive layer 204a made of, for example, metal. And the patterned CMP stop layer 206a is used to terminate the planarization process, for example, CMP. Because the patterned CMP stop layer 206a has a higher polishing rate selectivity than that of the second insulating layer 212 made of, for example, silicon oxide. Thus the patterned CMP stop layer 206a can prevent recession of the second insulating layer 212 resulting from the planarization process. The remaining second insulating layer 212a is thus formed with a top higher than the patterned first conductive layer 204a. And the second conductive layer 216 subsequently formed on the patterned first conductive layer 204a can be free from residue or short problems if a misalignment problem occurs.

FIGS. 3a to 3g show cross sections of another exemplary method for fabricating a semiconductor device of the invention. Fabrication processes of this embodiment are the same as those previously described with reference FIG. 2a, thus descriptions thereof are not repeated for brevity.

Figure 3A:
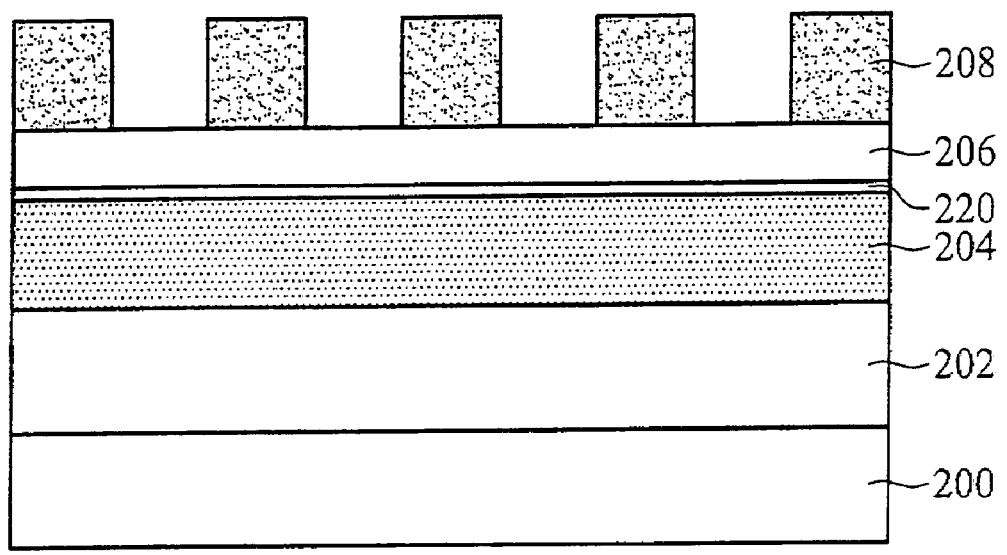
FIGS. 3a to 3g show cross sections of another exemplary method for fabricating a semiconductor device of the invention.

FIG. 3a illustrates an embodiment of forming a barrier layer 220 and a CMP stop layer 206. The CMP stop layer 206 is formed on the first conductive layer 204. The barrier layer 220 is then formed on the CMP stop layer 206. The barrier layer 220 may serve as a diffusion barrier layer or an adhesion enhancing layer between the CMP stop layer 206 and the first conductive layer 204. The barrier layer 220 may be formed by chemical vapor deposition (CVD) and/or physical vapor deposition (PVD). The barrier layer 220 may comprise metal. In one embodiment, the barrier layer 220 may comprise titanium (Ti), titanium nitride (TiN), tantalum (Ta), tantalum nitride (TaN) or combinations thereof. The CMP stop layer 206 may be formed by chemical vapor deposition (CVD) such as low pressure chemical vapor deposition (LPCVD) or plasma enhanced chemical vapor deposition (PECVD). The CMP stop layer 206 may comprise nitride-containing materials, for example, silicon nitride (SiN), titanium nitride (TiN) or combinations thereof. The CMP stop layer 206 serves as a stop layer for the subsequent planarization process. Next, a photoresist layer is formed on the CMP stop layer 206, following a photolithography process, to form a patterned photoresist layer 208. The patterned photoresist layer 208 is used to define an interconnect, memory bit-line or memory wordline position of the first conductive layer 204. After forming the CMP stop layer 206, a bottom anti-reflective coating (BARC) layer such as SiON may optionally be formed on the CMP stop layer 206. The BARC layer is used to reduce multiple interference in the photoresist layer 208. Thus critical dimension (CD) control and topography problems of the semiconductor device can be overcome. Also, the BARC layer can be replaced by the CMP stop 206 layer if the CMP stop layer 206 has a function of reducing multiple interference in photoresist.

Figure 3B:
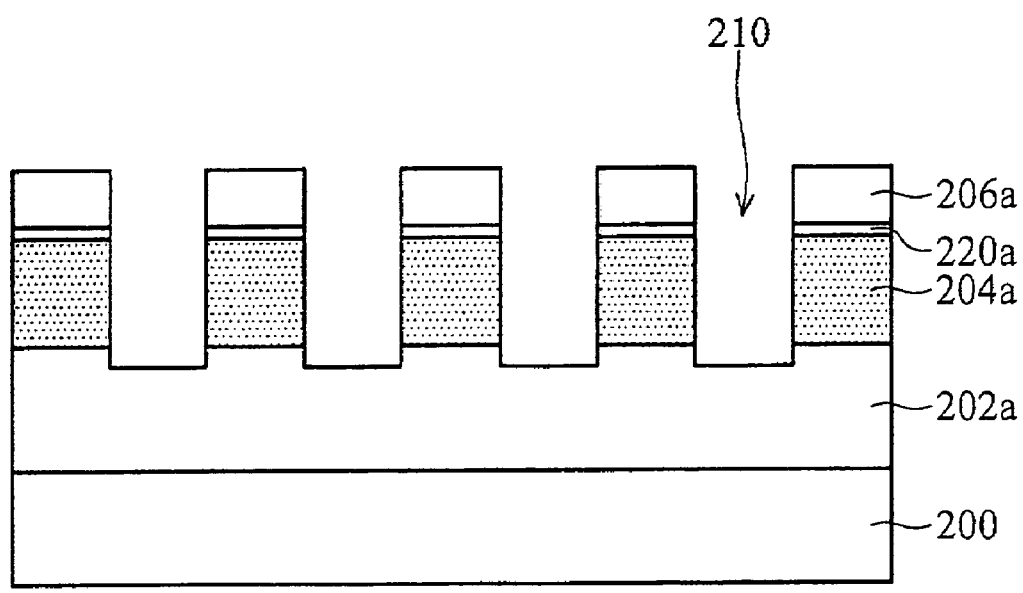

Referring to FIG. 3b, a plurality of openings 210 are formed in the CMP stop layer 206, the barrier layer 220 and the first conductive layer 204 to expose the first insulating layer 202, thereby leaving a patterned CMP stop layer 206a, a patterned barrier layer 220a, a patterned first conductive layer 204a and a first insulating layer 202a. In one embodiment, the patterned first conductive layer 204a may be a bit line or word line pattern of a semiconductor device. The openings 210 may be formed by anisotropic etching using the patterned photoresist layer 208 as a mask. Next, the patterned photoresist layer 208 is removed.

Figure 3C:
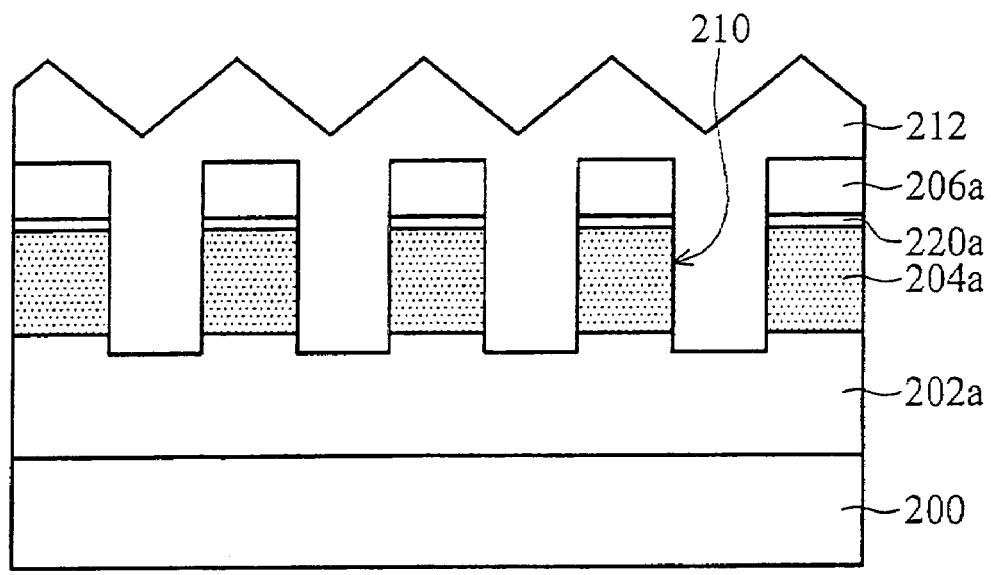

FIG. 3c illustrates formation of a second insulating layer 212. The second insulating layer 212 is formed on the patterned CMP stop layer 206a filling in the openings 210 by high density plasma CVD (HDP CVD). In a high density plasma CVD process, deposition and sputtering are performed simultaneously. Thus the second insulating layer 212 can be filled in the openings 210 with a tapered profile. The second insulating layer 212 may comprise a low dielectric constant (low-k) material formed by chemical vapor deposition (CVD). The low-k material may be defined as a dielectric material having a dielectric constant less than 3.9, that of a thermal silicon oxide. The low-k material may have a porous structure. The low-k materials may include carbon doped silicon oxide, Black Diamond® (Applied Materials of Santa Clara, Calif.), Xerogel, Aerogel, amorphous fluorinated carbon, Parylene, BCB (bis-benzocyclobutenes), SILK (Dow Chemical, Midland, Mich.), polyimide, SiOC, SOG (spin on glass), FSG (fluorinated silica glass), HSQ (hydrogensilsequioxane) and/or other proper materials. In one embodiment, the second insulating layer 212 may comprise the same material as the first insulating layer 202. In one embodiment, the second insulating layer 212 serves as an intermetal dielectric (IMD) layer.

Figure 3D:
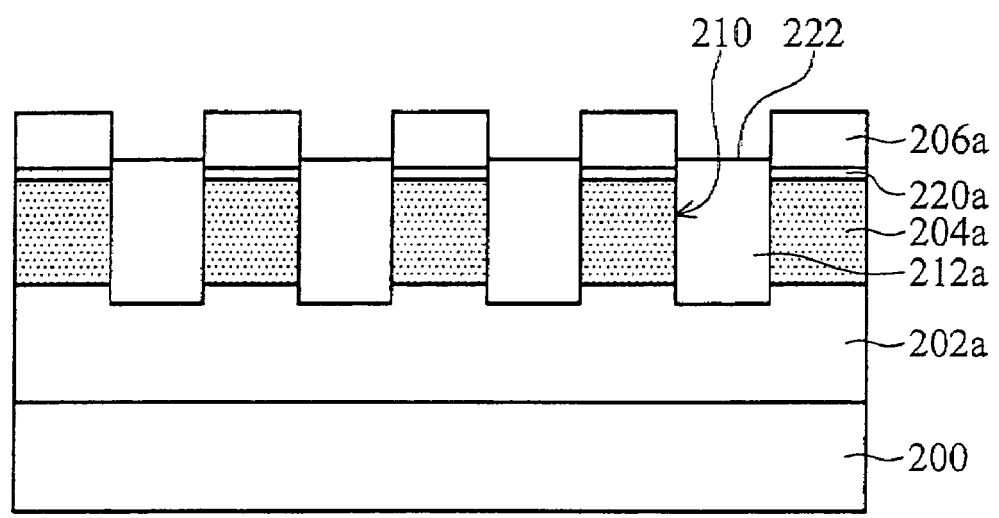
Figure 3E:
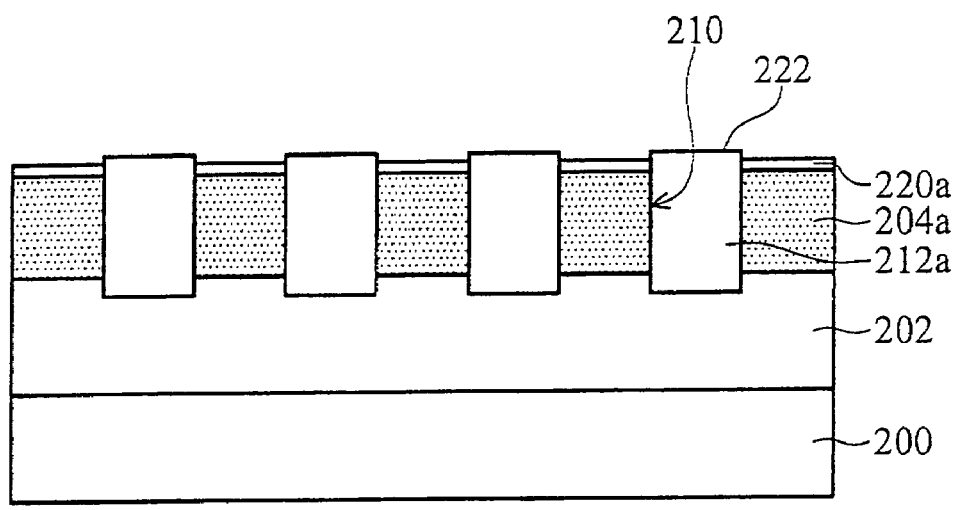

Referring to FIG. 3d, a planarization process such as chemical mechanical polishing (CMP) is performed to remove a portion of the second insulating layer 212 until the patterned CMP stop layer 206a is exposed, thereby leaving a remaining second insulating layer 212a. In one embodiment, the patterned CMP stop layer 206a is used to terminate the CMP process. Because the patterned CMP stop layer 206a has a higher polishing rate selectivity than that of the second insulating layer 212 made of, for example, silicon oxide. The remaining second insulating layer 212a is thus formed with a top 222 higher than the patterned first conductive layer 204a and barrier layer 220a and no recession occurs. Next, the patterned CMP stop layer 206a is removed as shown in FIG. 3e. In one embodiment, the patterned CMP stop layer 206a may be removed by wet etching, such as submersion in hot phosphoric acid ($H_3PO_4$). Alternatively, the patterned CMP stop layer 206a may be removed by an anisotropic etching process such as a dry etching process, for example, plasma etching.

Figure 3F:
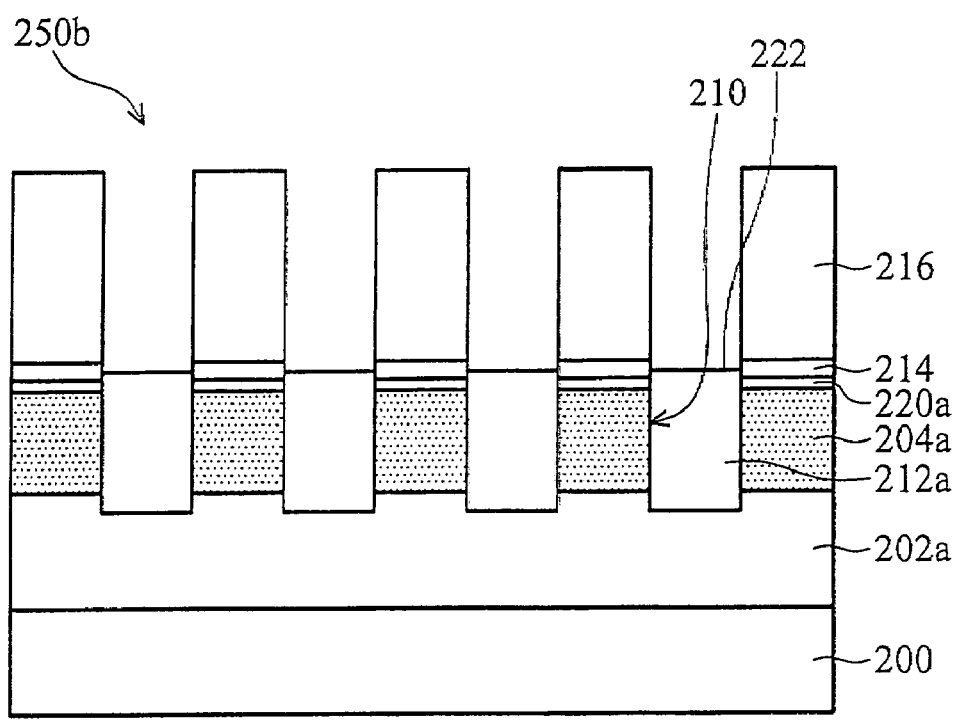

FIG. 3f illustrates formation of a barrier layer 214 and a second conductive layer 216. The barrier layer 214 is formed on the patterned first conductive layer 204a and the second conductive layer 216 is formed on the barrier layer 214. The second conductive layer 216 may be a conductive pillar formed by photolithography process. The second conductive layer 216 may serve as a plug or a via electrically connected to the patterned first conductive layer 204a through the barrier layer 214. In one embodiment, the barrier layer 214 may be formed optionally and serve as a diffusion barrier layer or an adhesion enhancing layer between the second conductive layer 216 and the patterned first conductive layer 204a. The patterned barrier layer 220a may also serve as a diffusion barrier layer or an adhesion enhancing layer between the second conductive layer 216 and the patterned first conductive layer 204a thus the barrier layer 214 can be omitted. The barrier layer 214 may be formed by chemical vapor deposition (CVD) and/or physical vapor deposition (PVD). The barrier layer 214 may comprise titanium (Ti), titanium nitride (TiN), tantalum (Ta), tantalum nitride (TaN) or combinations thereof. The second conductive layer 216 may be formed by chemical vapor deposition (CVD) and/or physical vapor deposition (PVD). The second conductive layer 216 may comprise polysilicon. In one embodiment, the second conductive layer 216 may comprise a diode device of a doped semiconductor layer and an undoped semiconductor layer to form a p-n junction, wherein the doped semiconductor layer may comprise an in-situ doped semiconductor layer formed by low pressure chemical vapor deposition (LPCVD) or a semiconductor layer doped by implanting impurities. The term "in-situ doped semiconductor layer" means that the semiconductor layer is implanted with impurities in one process step without an additional implantation process step. Thus, fabrication of a semiconductor device 250b is complete. Alternatively, a plurality of the semiconductor devices 250b may be laminated vertically by repeating the processes as shown in FIGS. 3a to 3f to form a 3-dimensional (3D) semiconductor device, and the number of the semiconductor devices 250b is not limited.

Figure 3G:
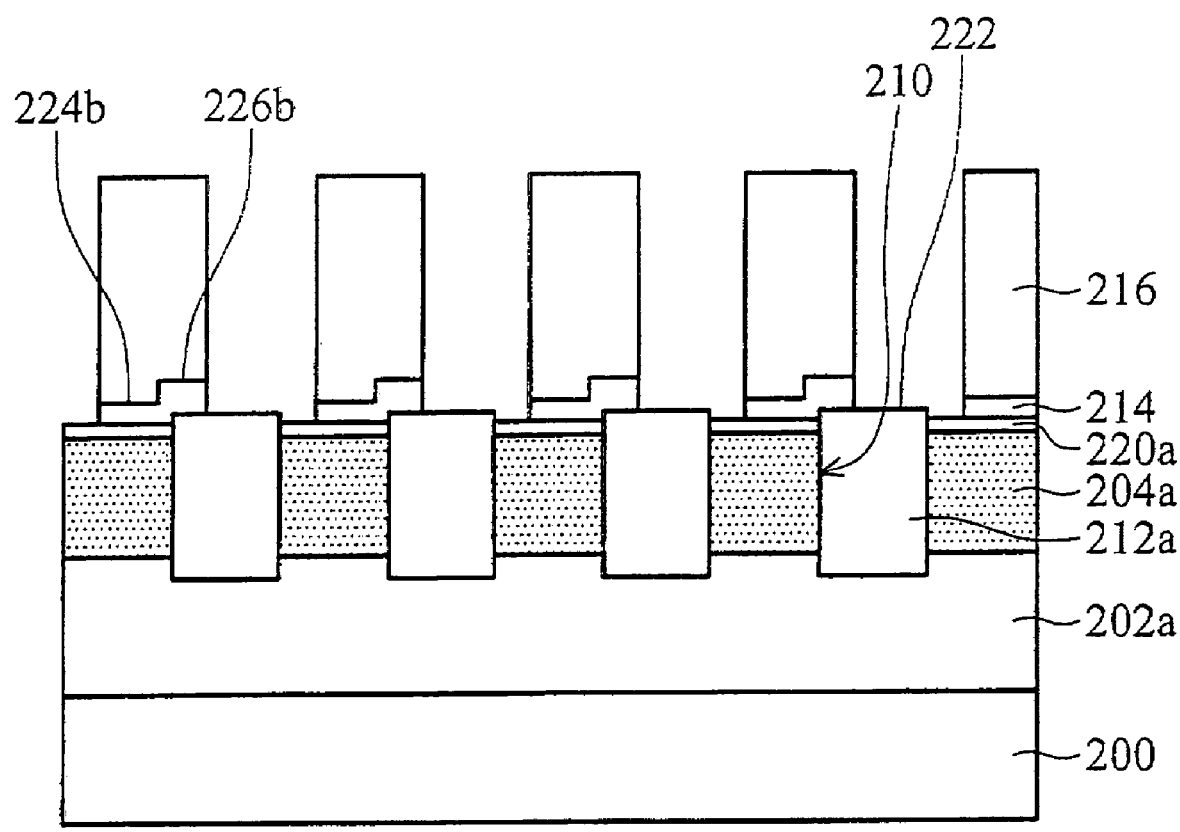

If a misalignment problem of the second conductive layer 216 occurs as shown on FIG. 3g. The second conductive layer 216 is formed with a first bottom portion 224b on the patterned first conductive layer 204a and a second bottom portion 226b on the remaining second insulating layer 212a. In this embodiment, the second bottom portion 226b is higher than the first bottom portion 224b. The second conductive layer 216 subsequently formed on the patterned first conductive layer 204a can be free from residue or short problems.

An exemplary embodiment of the semiconductor device 250b mainly comprises: a semiconductor substrate 200; a first insulating layer 202 on the semiconductor substrate 200; a patterned first conductive layer 204a, a overlying patterned barrier layer 220a and an adjacent second insulating layer 212a on the first insulating layer 202, wherein the remaining second insulating layer 212a is higher than the patterned first conductive layer 204a; a second conductive layer 216 on the patterned barrier layer 220a.

In an exemplary embodiment, the patterned CMP stop layer 206a is formed on the barrier layer 220 made of, for example, metal. And the patterned CMP stop layer 206a is used to terminate the planarization process, for example, CMP. The barrier layer 220 is used as a diffusion barrier layer or an adhesion enhancing layer between the first conductive layer 204 and the CMP stop layer 206. Because the patterned CMP stop layer 206a has a higher polishing rate selectivity than that of the second insulating layer 212 made of, for example, silicon oxide. Thus, the patterned CMP stop layer 206a can prevent recession of the second insulating layer 212 resulting from the planarization process. The remaining second insulating layer 212a is thus formed with a top higher than the patterned first conductive layer 204a. The second conductive layer 216 subsequently formed on the patterned first conductive layer 204a can be free from residue or short problems if a misalignment problem occurs.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of fabricating a semiconductor device, comprising:

providing a semiconductor substrate;

forming a first interlayer dielectric layer, a first interconnection metal layer and a chemical mechanical polishing (CMP) stop layer over the semiconductor substrate in sequence;

forming openings in the chemical mechanical polishing (CMP) stop layer and the underlying first interconnection metal layer to expose the first interlayer dielectric layer, thereby leaving a patterned chemical mechanical polishing (CMP) stop layer and a patterned first interconnection metal layer, wherein the openings are formed without passing through the first interlayer dielectric layer;

forming a second interlayer dielectric layer on the patterned chemical mechanical polishing (CMP) stop layer, filling in the openings;

performing a planarization process to remove a portion of the second interlayer dielectric layer until the patterned chemical mechanical polishing (CMP) stop layer is exposed, thereby leaving a remaining second interlayer dielectric layer in the openings;

removing the patterned chemical mechanical polishing (CMP) stop layer; and performing a photolithography process to form a conductive pillar on the patterned first interconnection layer, wherein a side of the remaining second interlayer dielectric layer simultaneously contacts a side of the patterned first interconnection layer and a side of the conductive pillar.

2. The method of fabricating the semiconductor device as claimed in claim 1, wherein the chemical mechanical polishing (CMP) stop layer comprises SiN, TiN or combinations thereof.

3. The method of fabricating the semiconductor device as claimed in claim 1, wherein the chemical mechanical polishing (CMP) stop layer is formed on a metal layer.

4. The method of fabricating the semiconductor device as claimed in claim 1, further comprising forming a barrier layer on the first interconnection metal layer before forming the chemical mechanical polishing (CMP) stop layer.

5. The method of fabricating the semiconductor device as claimed in claim 1, further comprising forming a bottom anti-reflective coating (BARC) layer on the chemical mechanical polishing (CMP) stop layer.

6. The method of fabricating the semiconductor device as claimed in claim 1, wherein the first interconnection metal layer comprises copper, aluminum, tungsten, titanium, titanium nitride, tantalum, tantalum nitride, metal silicide or combinations thereof.

7. The method of fabricating the semiconductor device as claimed in claim 1, wherein the remaining second interlayer dielectric layer in the openings is higher than the patterned first interconnection metal layer.

8. The method of fabricating the semiconductor device as claimed in claim 1, wherein the conductive pillar has a first bottom portion on the patterned first interconnection metal layer and a second bottom portion on the remaining second interlayer dielectric layer.

9. The method of fabricating the semiconductor device as claimed in claim 1, wherein the conductive pillar is polysilicon.

10. The method of fabricating the semiconductor device as claimed in claim 1, wherein the first interlayer dielectric layer comprises carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, SiOC, SOG (spin on glass), FSG (fluorinated silica glass), HSQ (hydrogensilsequioxane) or other low-k materials.

11. The method of fabricating the semiconductor device as claimed in claim 1, wherein the first interlayer dielectric layer and second interlayer dielectric layer comprise the same material.

12. The method of fabricating the semiconductor device as claimed in claim 1, wherein the planarization process is chemical mechanical polishing.

13. The method of fabricating the semiconductor device as claimed in claim 4, wherein the barrier layer comprises titanium (Ti), titanium nitride (TiN), tantalum (Ta), tantalum nitride (TaN).

14. The method of fabricating the semiconductor device as claimed in claim 8, wherein the second bottom portion is higher than the bottom on the first bottom portion.

15. The method of fabricating the semiconductor device as claimed in claim 9, wherein the conductive pillar is a diode device of a doped semiconductor layer and an undoped semiconductor layer to form a p-n junction.

16. The method of fabricating the semiconductor device as claimed in claim 15, wherein the doped semiconductor layer comprise an in-situ doped semiconductor layer formed by low pressure chemical vapor depositon (LPCVD) or a semiconductor layer doped by implanting impurities.

* * * * *